United States Patent

Tan et al.

[11] Patent Number: 5,921,377
[45] Date of Patent: Jul. 13, 1999

[54] CONVEYOR AND CONVEYOR SYSTEM FOR CONVEYING CIRCUIT BOARDS HAVING DIFFERENT WIDTHS

[75] Inventors: Kok Kiang Tan; Hun Chiang Lim; Ka Tiek Lim, all of Penang, Malaysia

[73] Assignee: Motorola, Inc., Schaumburg, Ill.

[21] Appl. No.: 08/859,452

[22] Filed: May 20, 1997

Related U.S. Application Data

[30] Foreign Application Priority Data

Sep. 13, 1996 [MY]  Malaysia ............................ PI 9603804

[51] Int. Cl.⁶ .................................................. B65G 15/10
[52] U.S. Cl. ......................................... 198/817; 198/626.5
[58] Field of Search ............................. 198/341.01, 604, 198/606, 626.3, 626.5, 817, 341.04

[56] References Cited

U.S. PATENT DOCUMENTS

| | | | |
|---|---|---|---|
| 5,135,435 | 8/1992 | Rasmussen | 198/626.3 X |
| 5,450,946 | 9/1995 | Sticht | 198/817 |
| 5,791,453 | 8/1998 | Schmits et al. | 198/817 X |
| 5,813,518 | 9/1998 | Kirker | 198/817 |
| 5,823,316 | 10/1998 | Shaw et al. | 198/817 X |

OTHER PUBLICATIONS

Byrd & Tippett, "Transfer Mechanism for Processing Printed Wiring Boards", Western Electric Company Inc., Oct. 1976.

*Primary Examiner*—James R. Bidwell
*Attorney, Agent, or Firm*—Dale W. Dorinski

[57] ABSTRACT

A conveyor system with a preceding conveyor (2) and a conveyor (3). The conveyor (3) has a plurality of board supports (8) for conveying circuit boards (4,5) having different widths. The board supports (8) are provided with abutment members (16) of which some coact with complementary abutment members (17). The board supports (8) are coupled to a continuous flexible member in the form of a chain (15) and are adjustable to vary a distance (20) between the abutment members (16) and the complementary abutment members (17). The board supports (8) are set by a setting actuator (6) based on widths of the circuit boards (4,5). A resetting actuator resets the board supports (8) after conveying the circuit boards (4,5). Additional embodiments of the board supports (8) include telescopic members and guides.

13 Claims, 4 Drawing Sheets

CONVEYOR AND CONVEYOR SYSTEM FOR CONVEYING CIRCUIT BOARDS HAVING DIFFERENT WIDTHS

FIELD OF THE INVENTION

This invention relates to a conveyor and conveyor system for conveying circuit boards in production assembly lines and, in particular, to a conveyor and conveyor system for conveying circuit boards having different widths through assembly processes.

BACKGROUND OF THE INVENTION

In a production assembly line, circuit boards are conventionally transported on conveyors through assembly processes such as solder stenciling or reflow soldering. Typically, these conveyors are parallel tracks with regularly spaced supports distributed along a flexible member, such as a chain, for supporting the circuit boards. However, to accommodate circuit boards having different widths, the parallel tracks need adjustments which increases overall production time. Production time is further increased because circuit boards of one width have to be completely conveyed through the conveyor before such adjustments can be made to accommodate circuit boards of another width.

During conveyance, factors such as levelness and stability are important for component mounting. For example, when components are held by molten solder during reflow soldering, tilting or inadvertently shaking the boards can cause components to be displaced from their desired mounting positions.

Conveyors known in the art include U.S. Pat. No. 4,759,436 which discloses a conveyor with adjustable supports for conveying objects along a curved path which could also be applied to objects having different widths. The supports are pivotal about a horizontal axis to accommodate movement of a free end to support the objects. Unfortunately, the movement of the free end can cause tilting of objects such as circuit boards. Also known in the art is U.S. Pat. No. 4,840,268 which discloses an adjustable width chain conveyor with inner plates and adjustably sliding on inclined portions. Movement of the conveyor within guide rails allows for small variations in widths of circuit boards being conveyed. In conveying circuit boards having different widths, height of the circuit boards above a ground plane also varies. The inner plates, however, obstructs conventional overhead solder stenciling or reflow heat for soldering components. In addition, the sliding of the chain along the inclined portions may not be equal on both sides and, therefore, the circuit boards may tilt during conveyance. Both conveyors described above are also of a size that is inappropriate for use within conventional reflow ovens which typically have limited vertical spaces. Furthermore, contact with the adjustable supports or the inner plates when loading circuit boards onto the conveyors can cause an impact of a sufficient strength to displace unsoldered components. Hence, these conveyors are not suitable for use when solder stenciling or reflowing circuit boards.

It is desirable, therefore, for conveyors to be effective in conveying circuit boards having different widths through assembly processes such as solder stenciling and reflow soldering.

SUMMARY OF THE INVENTION

It is an object of this invention to overcome or at least alleviate at least one of the limitations associated with conveyors or conveyor systems for conveying circuit boards having different widths through assembly processes such as solder stenciling and reflow soldering.

According to one aspect of the invention, there is provided a conveyor system for conveying circuit boards having different widths, said conveyor system comprising:
  a conveyor having:
    a continuous flexible member;
    a plurality of board supports coupled to said continuous flexible member and movable along a length of said conveyor, said board supports having one or more abutment members for abutting a board;
    one or more complementary abutment members, associated with said conveyor, for coacting with at least some of said abutment members,
      wherein said board supports are adjustable to vary a distance between said abutment members and said complementary abutment members to thereby support a circuit board in a horizontal plane during said conveying thereof along said length of said conveyor; and
  a preceding conveyor for transferring the circuit boards to said conveyor, wherein said preceding conveyor is associated with a setting actuator for setting said distance in accordance with the different widths prior to start of said conveying.

Preferably, said board supports may coact with a resetting actuator associated with said conveyor for resetting said board supports to a state suitable for said setting by said setting actuator after said conveying.

Suitably, said board supports can be adapted to extend laterally from said continuous flexible member and parallel to said horizontal plane.

Preferably, said conveyor may include an opposite support, wherein said complementary abutment members extend from said opposite support, and wherein said opposite support is parallel to said continuous flexible member.

Suitably, at least part of said continuous flexible member may be supported in a track.

According to another aspect of the invention, there is provided a conveyor for conveying circuit boards having different widths, said conveyor comprising:
  a continuous flexible member;
  a plurality of board supports coupled to said continuous flexible member and movable along a length of said conveyor, said board supports having one or more abutment members for abutting a board; and
  one or more complementary abutment members, associated with said conveyor, for coacting with at least some of said abutment members,
    wherein said board supports are adjustable to vary a distance between said abutment members and said complementary abutment members to thereby support a circuit board in a horizontal plane during said conveying thereof along said length of said conveyor.

Preferably, said board supports may coact with a setting actuator for setting said distance in accordance with said different widths prior to start of said conveying.

Suitably, said setting actuator may be associated with a preceding conveyor for transferring the circuit boards to said conveyor.

Preferably, said setting actuator can be a ramp.

Suitably, said board supports may coact with a resetting actuator associated with said conveyor for resetting said board supports to a state suitable for said setting by said setting actuator after said conveying.

Preferably, said resetting actuator can be a ramp.

Suitably, said board supports can be adapted to extend laterally from said continuous flexible member and parallel to said horizontal plane.

Preferably, said conveyor may include an opposite support, wherein said complementary abutment members extend from said opposite support, and wherein said opposite support is parallel to said continuous flexible member.

Suitably, at least part of said continuous flexible member may be supported in a track.

Preferably, each of said board supports may comprise a swivel member pivotally mounted about a vertical axis to said continuous flexible member to provide relative movement between said abutment members and said continuous flexible member.

In an alternate form, each of said board supports may comprise a telescopic member mounted to said continuous flexible member to provide relative movement between said abutment members and said continuous flexible member.

In another alternate form, each of said board supports may comprise one or more guides mounted to said continuous flexible member.

Preferably, said abutment members can be movably coupled to said guides to provide relative movement between said abutment members and said continuous flexible member.

Suitably, relative movement can be provided by said abutment members and said complementary abutment members both movably coupled to said guides.

BRIEF DESCRIPTION OF THE DRAWINGS

In order to describe the invention and to put it into practical effect, reference will now be made to preferred embodiments as illustrated with reference to the accompanying drawings in which.

DETAILED DESCRIPTION OF THE INVENTION

Figure 1:
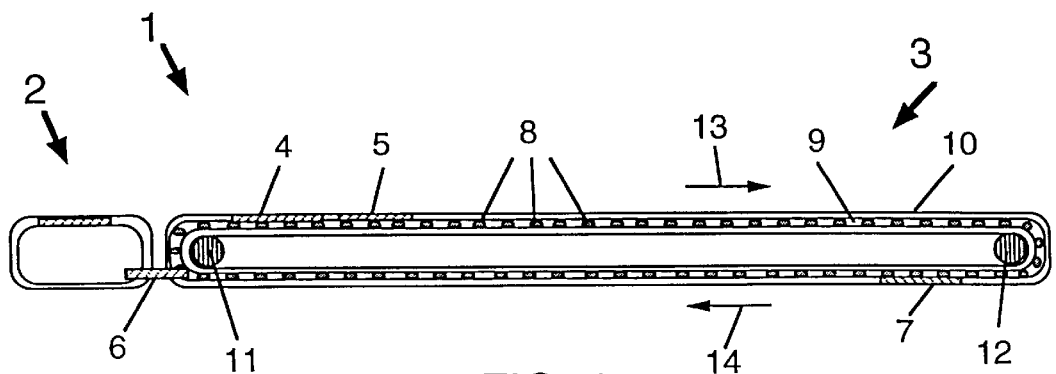
FIG. 1 shows a side view of part of a conveyor system in accordance with a preferred embodiment of the invention.

FIG. 1 shows a side view of part of a conveyor system 1. The conveyor system 1 comprises a preceding conveyor 2 and a conveyor 3. The preceding conveyor 2 transfers circuit boards 4,5 having different widths to the conveyor 3 and is associated with a setting actuator 6. The conveyor 3 includes a resetting actuator 7, a plurality of board supports 8 and a continuous flexible member 9 supported in a track 10. The continuous flexible member 9 is mounted to sprockets 11,12 one of which is free wheeling and another being coupled to a drive motor (not shown). The circuit boards 4,5 are conveyed along a length of the conveyor 3 in a conveying direction indicated with arrow 13. Upon conveyance of the circuit boards 4,5, the conveyor 3 loops back towards the preceding conveyor 2 in a direction indicated with arrow 14.

Figure 2:
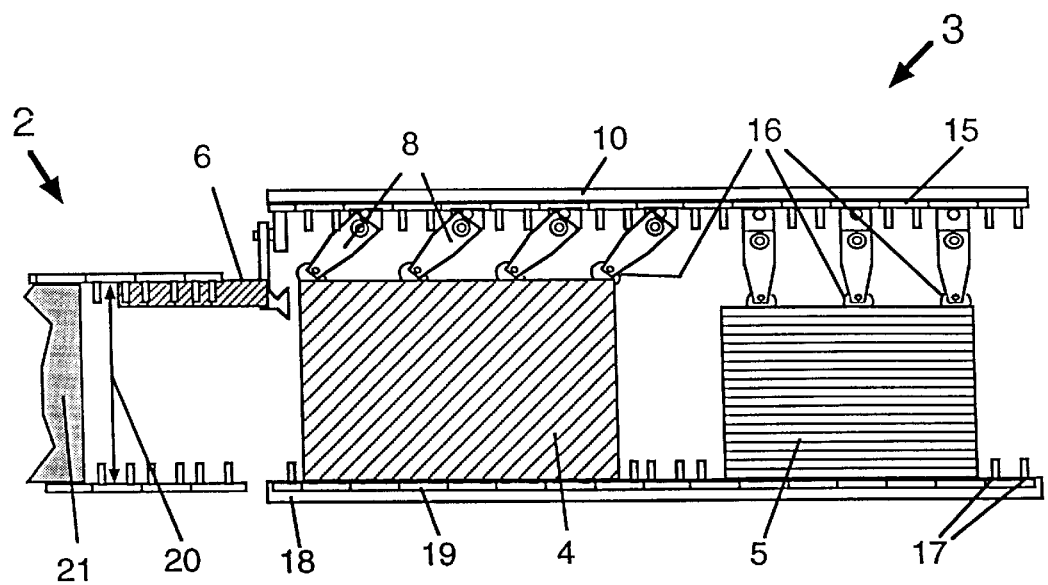
FIG. 2 is a plan view of part of the conveyor system of FIG. 1 with one embodiment of board supports conveying circuit boards having different widths.

FIG. 2 is a plan view of part of the conveyor system 1 with one embodiment of board supports 8 conveying the circuit boards 4,5 having different widths. The board supports 8 are coupled to the continuous flexible member 9 and are movable along the length of the conveyor 3. The continuous flexible member 9 in this embodiment is in the form of a chain 15. Each of the board supports 8 has one or more abutment members 16 for abutting a circuit board. The conveyor 2 also includes an opposite support that is parallel to the chain 15. One or more complementary abutment members 17 for coacting with some of the abutment members 16 extend from the opposite support. In this embodiment, the opposite support is in the form of an opposite track 18 supporting a chain 19 which moves in unison with the chain 15. The board supports 8 are adjustable to vary a distance 20 between the abutment members 16 and the complementary abutment members 17 to thereby support a circuit board in a horizontal plane during conveying along the conveyor 3. In the conveying, the board supports 8 extend laterally from the chain 15 and parallel to the horizontal plane. FIG. 2 shows the setting actuator 6 setting the distance 20 in accordance with width of a circuit board 21 prior to start of the conveying.

Figure 3:
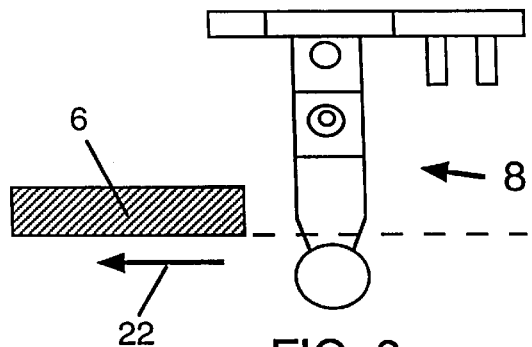
FIG. 3 shows a setting actuator about to set a board support of FIG. 2.

FIG. 3 shows the setting actuator 6 about to set a board support 8 to the distance 20 that is appropriate for supporting a circuit board. In this embodiment, the setting actuator 6 is a protruding bar. Movement of the board support 8 in a setting direction towards the setting actuator 6 is indicated by arrow 22. Accordingly, prior to the start of the conveying, the board supports 8 coact with the setting actuator 6 for setting the distance 20.

Figure 4:
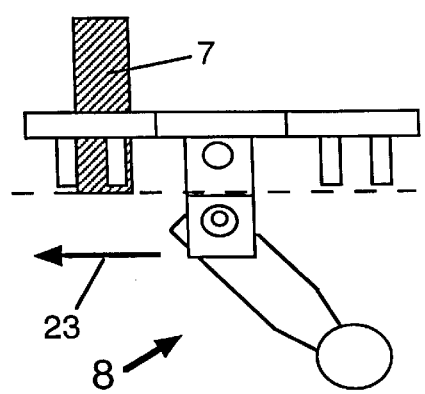
FIG. 4 shows a resetting actuator about to reset a board support of FIG. 2.

FIG. 4 shows the resetting actuator 7 about to reset a board support 8 after conveying. In this embodiment, the resetting actuator 7 is also a protruding bar. Movement of the board support in a resetting direction towards the resetting actuator 7 is indicated by arrow 23. Accordingly, the board supports 8 coact with the resetting actuator 7 for resetting to a state suitable for setting by the setting actuator 6. In this alternate embodiment, the board supports 8 are reset to the state when they are at a maximum length that is orthogonal relative to the chain 15.

Figure 5:
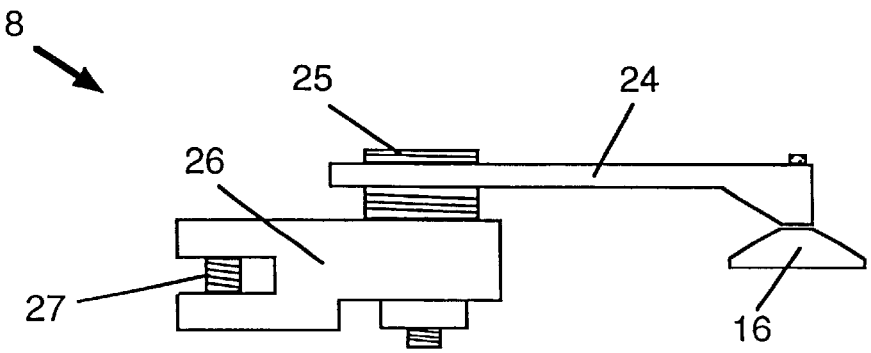
FIG. 5 is a side view of a board support of FIG. 2.

FIG. 5 is a side view of a board support 8 of FIG. 2 showing a swivel member 24 with an abutment member 16. The swivel member 24 couples with a pivot screw 25 to a connector 26 for connecting the board support 8 to the chain 15 with a connector screw 27. Accordingly, the swivel member 24 of each of the board supports 8 is pivotally mounted about a vertical axis to the chain 15 to provide relative movement between the abutment members 16 and the chain 15.

Figure 6:
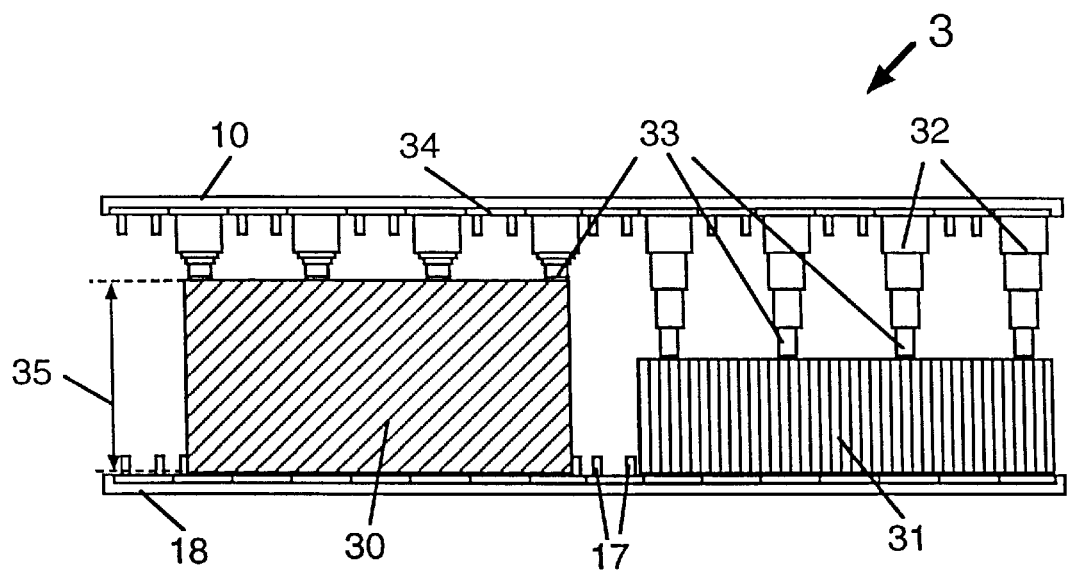
FIG. 6 is a plan view of part of the conveyor of FIG. 1 with an alternate embodiment of board supports conveying circuit boards having different widths.

FIG. 6 is a plan view of part of the conveyor 3 with an alternate embodiment of board supports 8 conveying circuit boards 30,31 having different widths. The board supports 8 in this alternate embodiment comprise telescopic members 32 having abutment members 33. The telescopic members 32 are mounted to the continuous flexible member 9 in the form of a chain 34. The telescopic members 32 are movable along the length of the conveyor 3 to provide relative movement between the abutment members 33 and the chain 34 to thereby vary a distance 35 as indicated in FIG. 6.

Figures 7, 8:
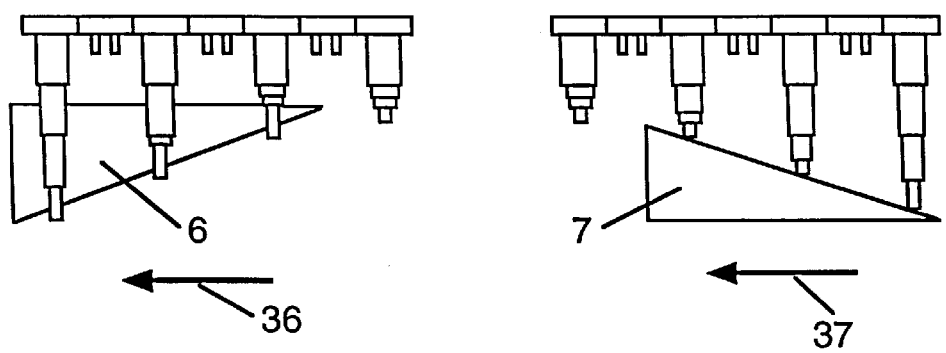
FIG. 7 shows a setting actuator when setting some board supports of FIG. 6.
FIG. 8 shows a resetting actuator when resetting some board supports of FIG. 6.

FIG. 7 shows the setting actuator 6 when setting some board supports 8 of the alternate embodiment of FIG. 6 to the distance 35. In this alternate embodiment, the setting actuator 6 is a ramp. Movement of the board supports 8 in a setting direction is indicated by arrow 36.

FIG. 8 shows the resetting actuator 7 when resetting some board supports 8 of the alternate embodiment of FIG. 6 after conveying circuit boards. In this alternate embodiment, the resetting actuator 7 is also a ramp. Movement of the board supports 8 in a resetting direction is indicated by arrow 37. The board supports 8 coact with the resetting actuator 7 for resetting to a state suitable for setting by the setting actuator 6. In this alternate embodiment, the resetting actuator 7 enables the board supports 8 to attain the state of having a minimum length when a telescopic member 32 is fully retracted.

Figure 9:
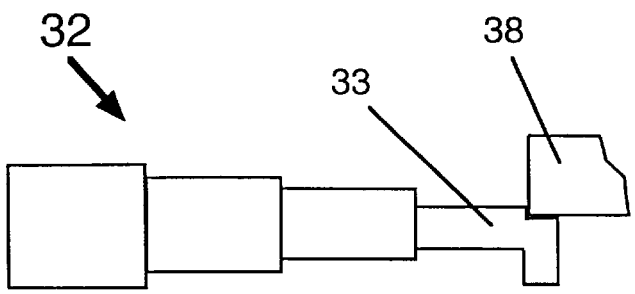
FIG. 9 is a side view of a board support of FIG. 6 at a maximum length and supporting an edge of a circuit board.
Figure 10:
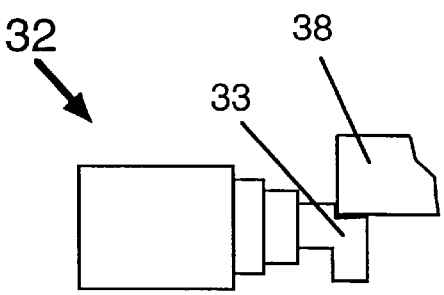
FIG. 10 is a side view of a board support of FIG. 6 at a minimum length and supporting an edge of a circuit board.

FIGS. 9 and 10 show a telescopic member 32 of FIG. 6 at a maximum length and a minimum length, respectively, and supporting an edge 38 of a circuit board. Regardless of widths of circuit boards that are to be transferred from the preceding conveyor 2, the resetting actuator 7 in this alternate embodiment resets the telescopic member 32 to the minimum length for the setting actuator 6. Accordingly, the distance 35 representing the widths of circuit boards is variable between the maximum length and the minimum length.

Figure 11:
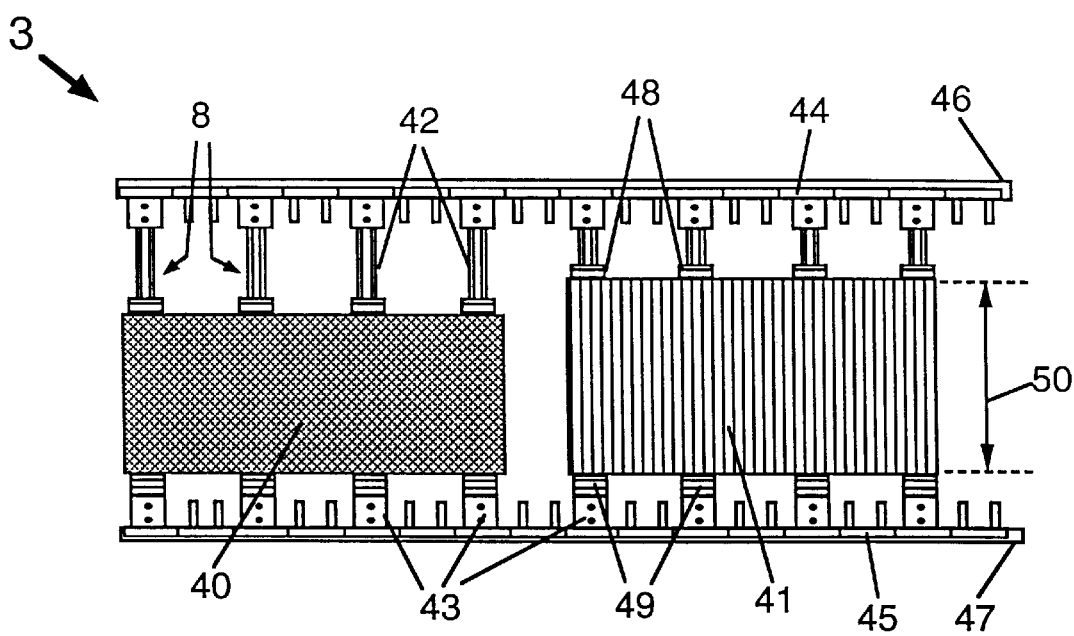
FIG. 11 is a plan view of part of the conveyor of FIG. 1 with another alternate embodiment of board supports conveying circuit boards having different widths.

FIG. 11 is a plan view of part of the conveyor 3 with another alternate embodiment of the board supports 8 conveying circuit boards 40,41 having different widths. In this alternate embodiment, each of the board supports 8 comprises one or more guides 42 mounted with connectors 43 to a continuous flexible member and an opposite support. The continuous flexible member and the opposite support are respectively in the form of chains 44,45 supported by tracks 46,47. Also shown in FIG. 11 are abutment members 48 and complementary abutment members 49. The abutment members 48 movably couple to the guides 42 to provide relative movement between the abutment members 48 and the chain 44. A distance 50 between the abutment members 48 and the complementary abutment members 49 is indicated in FIG. 11.

Figure 12:
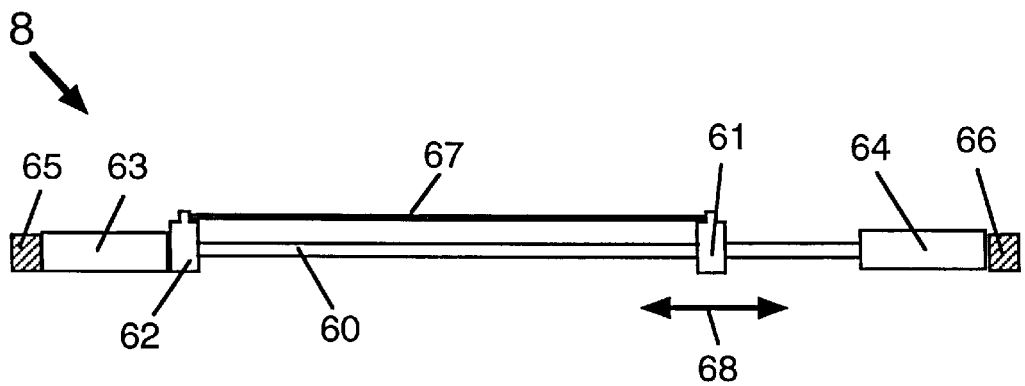
FIG. 12 is a side view of a board support of FIG. 11.

FIG. 12 shows a side view of a board support 8 of FIG. 11 comprising a guide 60, an abutment member 61, a complementary abutment member 62 and two connectors 63,64 for coupling to chains 65,66. FIG. 12 also shows a circuit board 67 being abutted by the abutment member 61 and the complementary abutment member 62. The complementary abutment member 62 is fixed to the guide 60 whereas the abutment member 61 is movably coupled to the guide 60 and adjustable in directions indicated with arrow 68. Accordingly, relative movement between the abutment member 61 and the chain 66 enables support of circuit boards having different widths.

Figure 13:
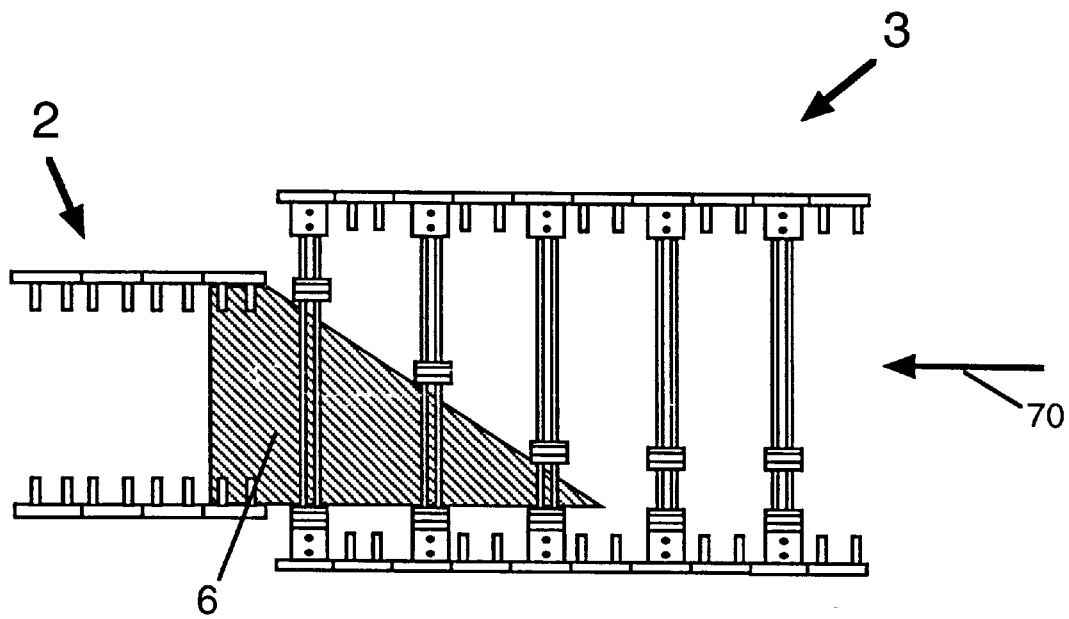
FIG. 13 shows a setting actuator when setting some board supports of FIG. 11.

FIG. 13 shows a setting actuator 6 when setting some board supports 8 of FIG. 11. Movement of the board supports 8 for setting are in the direction indicated by arrow 70 which is when the conveyor 3 loops back towards the preceding conveyor 2 as shown with arrow 14 in FIG. 1. In this alternate embodiment, the setting actuator 6 is a ramp that sets the abutment members 48 to widths of circuit boards transferred from the preceding conveyor 2.

Figure 14:
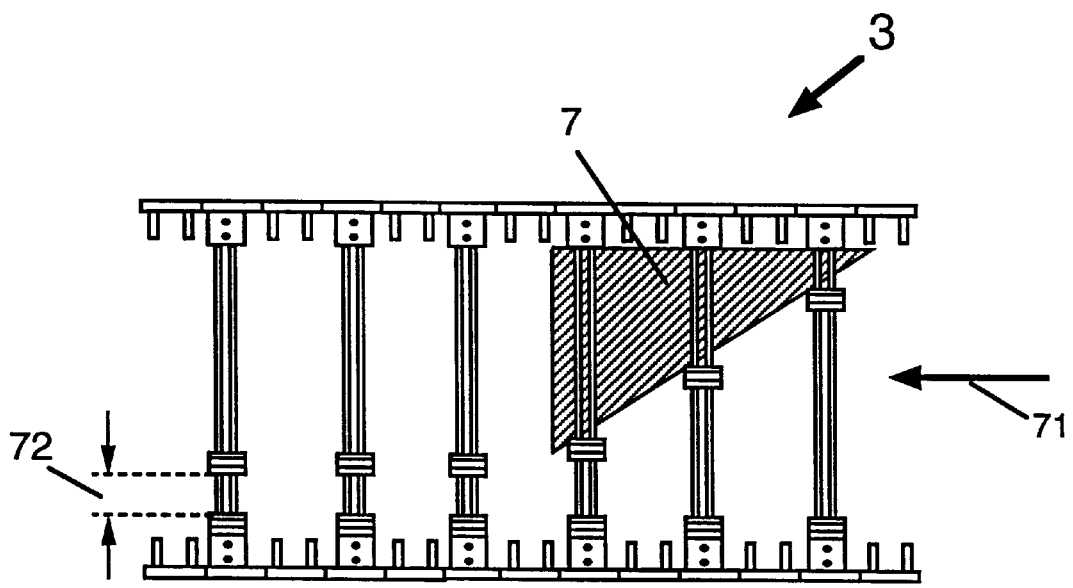
FIG. 14 shows a resetting actuator when resetting some board supports of FIG. 11.

FIG. 14 shows a resetting actuator 7 when resetting some board supports 8 of FIG. 11. Movement of the board supports 8 for resetting are in the direction indicated by arrow 71. The resetting actuator 7 is also a ramp that resets the distance 50 to a minimum for the setting actuator 6 to set accordingly. A minimum distance 72 after the resetting is indicated in FIG. 14.

The invention described above advantageously enables conveyance of circuit boards having different widths through assembly processes. Unlike prior art conveyors that may not convey such circuit boards with sufficient levelness, the invention provides for a consistent levelness that is critical to avoid tilting during assembly processes such as solder stenciling or reflow soldering. A further advantage of the invention is that circuit boards can be conveyed randomly without adjustments that increases production time whenever circuit boards having a different width are to be conveyed. Furthermore, the invention is appropriate for use within assembly equipment which have limited vertical spaces such as conventional reflow ovens.

Although the invention has been described with reference to preferred embodiments, it is to be understood that the invention is not restricted to the embodiments described herein.

We claim:

1. A conveyor system for conveying circuit boards having different widths, said conveyor system comprising:
    a conveyor having:
        a continuous flexible member;
        a plurality of board supports coupled to said continuous flexible member and movable along a length of said conveyor, said board supports having one or more abutment members for abutting a board;
        one or more complementary abutment members, associated with said conveyor, for coacting with at least some of said abutment members,
            wherein said board supports are adjustable to vary a distance between said abutment members and said complementary abutment members to thereby support a circuit board in a horizontal plane during said conveying thereof along said length of said conveyor,
            further wherein said board supports coact with a resetting actuator associated with said conveyor for resetting said board supports to a state suitable for said setting by said setting actuator after said conveying and
    a preceding conveyor for transferring the circuit boards to said conveyor, wherein said preceding conveyor is associated with a setting actuator for setting said distance in accordance with the different widths prior to start of said conveying.

2. The conveyor system of claim 1, wherein said board supports are adapted to extend laterally from said continuous flexible member and parallel to said horizontal plane.

3. The conveyor system of claim 1, wherein said conveyor includes an opposite support, wherein said complementary abutment members extend from said opposite support and wherein said opposite support is parallel to said continuous flexible member.

4. The conveyor system of claim 1, wherein at least part of said continuous flexible member is supported in a track.

5. A conveyor for conveying circuit boards having different widths, said conveyor comprising:

a continuous flexible member;

a plurality of board supports coupled to said continuous flexible member and movable along a length of said conveyor, said board supports having one or more abutment members for abutting a board; and one or more complementary abutment members, associated with said conveyor, for coacting with at least some of said abutment members, wherein said board supports are adjustable to vary a distance between said abutment members and said complementary abutment members to thereby support a circuit board in a horizontal plane during said conveying thereof along said length of said conveyor, further wherein said board supports coact with a setting actuator and a resetting actuator, said setting actuator being for setting said distance in accordance with said different widths prior to start of said conveying and said resetting actuator being for resetting said board supports to a state suitable for said setting by said setting actuator after said conveying.

6. The conveyor of claim 5, wherein said board supports are adapted to extend laterally from said continuous flexible member and parallel to said horizontal plane.

7. The conveyor of claim 5, wherein said conveyor includes an opposite support, wherein said complementary abutment members extend from said opposite support, and wherein said opposite support is parallel to said continuous flexible member.

8. The conveyor of claim 5, wherein at least part of said continuous flexible member is supported in a track.

9. The conveyor of claim 5, wherein each of said board supports comprises a swivel member pivotally mounted about a vertical axis to said continuous flexible member to provide relative movement between said abutment members and said continuous flexible member.

10. The conveyor of claim 5, wherein each of said board supports comprises a telescopic member mounted to said continuous flexible member to provide relative movement between said abutment members and said continuous flexible member.

11. The conveyor of claim 5, wherein each of said board supports comprises one or more guides mounted to said continuous flexible member.

12. The conveyor of claim 11, wherein said abutment members movably couple to said guides to provide relative movement between said abutment members and said continuous flexible member.

13. The conveyor of claim 11, wherein relative movement is provided by said abutment members and said complementary abutment members both movably coupled to said guides.

* * * * *